(12) United States Patent
Kondo et al.

(10) Patent No.: US 12,027,510 B2
(45) Date of Patent: Jul. 2, 2024

(54) LIGHT-EMITTING ELEMENT ARRAY CHIP, LIGHT-EMITTING DEVICE, OPTICAL DEVICE, AND INFORMATION PROCESSING DEVICE

(71) Applicant: FUJIFILM BUSINESS INNOVATION CORP., Tokyo (JP)

(72) Inventors: Takashi Kondo, Ebina (JP); Satoshi Inada, Ebina (JP); Takeshi Minamiru, Ebina (JP); Daisuke Iguchi, Ebina (JP); Kazuhiro Sakai, Ebina (JP); Tomoaki Sakita, Ebina (JP); Michiaki Murata, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 481 days.

(21) Appl. No.: 17/355,270

(22) Filed: Jun. 23, 2021

(65) Prior Publication Data

US 2021/0320479 A1     Oct. 14, 2021

Related U.S. Application Data

(63) Continuation of application No. PCT/JP2019/026709, filed on Jul. 4, 2019.

(30) Foreign Application Priority Data

Mar. 25, 2019   (JP) ................. 2019-056926

(51) Int. Cl.
   *H01L 25/16*    (2023.01)
   *G01B 11/24*    (2006.01)
   (Continued)

(52) U.S. Cl.
   CPC ............ *H01L 25/167* (2013.01); *G01B 11/24* (2013.01); *G06V 20/64* (2022.01); *G06V 40/172* (2022.01);
   (Continued)

(58) Field of Classification Search
   CPC ....... H01L 25/167; H01L 31/12; H01L 33/46; H01L 33/60; H01L 33/62; H01S 5/0425; H01S 5/0262; H01S 5/34313; G01B 11/24
   See application file for complete search history.

(56) References Cited

U.S. PATENT DOCUMENTS 5,513,204 A    4/1996   Jayaraman
5,583,350 A    12/1996  Norman et al.
(Continued)

FOREIGN PATENT DOCUMENTS

CN    107884066 A    4/2018
JP    H10-501927 A   2/1998
(Continued)

OTHER PUBLICATIONS

Sep. 10, 2019 International Search Report issued in International Patent Application No. PCT/JP2019/026709.
(Continued)

*Primary Examiner* — Mohsen Ahmadi
(74) *Attorney, Agent, or Firm* — Oliff PLC

(57) ABSTRACT

A light-emitting element array chip includes: a first light-emitting element array that includes a first light-emitting element including a first substrate, a light-emitting element layer formed on the first substrate, and a first cathode electrode electrically connected to the light-emitting element layer; and a second light-emitting element array that includes a second light-emitting element including a second substrate, a non-p-type lower reflector formed on the second substrate, and a second cathode electrode electrically connected to the non-p-type lower reflector, in which the first light-emitting element array is provided on an emission surface side of the second light-emitting element array.

11 Claims, 11 Drawing Sheets

(51) Int. Cl.
*G06V 20/64* (2022.01)
*G06V 40/16* (2022.01)
*H01S 5/02257* (2021.01)
*H01S 5/02345* (2021.01)
*H01S 5/0236* (2021.01)
*H01S 5/0239* (2021.01)
*H01S 5/026* (2006.01)
*H01S 5/183* (2006.01)
*H01S 5/343* (2006.01)
*H01S 5/42* (2006.01)
*H01L 33/46* (2010.01)
*H01L 33/60* (2010.01)

(52) U.S. Cl.
CPC ........ *H01S 5/02257* (2021.01); *H01S 5/0236* (2021.01); *H01S 5/0239* (2021.01); *H01S 5/0262* (2013.01); *H01S 5/18361* (2013.01); *H01S 5/34313* (2013.01); *H01S 5/423* (2013.01); *H01L 33/46* (2013.01); *H01L 33/60* (2013.01)

(56) References Cited

U.S. PATENT DOCUMENTS

| | | | |
|---|---|---|---|
| 5,734,225 | A | 3/1998 | Biebuyck et al. |
| 5,963,568 | A | 10/1999 | Paoli |
| 8,368,100 | B2 | 2/2013 | Donofrio et al. |
| 9,082,921 | B2 | 7/2015 | Wilcox et al. |
| 10,135,222 | B2 | 11/2018 | Hogan et al. |
| 2002/0061036 | A1 | 5/2002 | Estevez-Garcia |
| 2004/0149982 | A1 | 8/2004 | Michler |
| 2004/0208210 | A1* | 10/2004 | Inoguchi ............... H01L 24/97 |
| | | | 257/E33.072 |
| 2007/0176554 | A1 | 8/2007 | Kwak |
| 2009/0262545 | A1 | 10/2009 | Amelung et al. |
| 2013/0308672 | A1 | 11/2013 | Pan et al. |
| 2014/0241387 | A1 | 8/2014 | Ortiz |
| 2015/0362776 | A1* | 12/2015 | Jikumaru ............... H10K 59/40 |
| | | | 349/12 |
| 2016/0352071 | A1* | 12/2016 | Hogan ................. H01S 5/1835 |
| 2017/0372113 | A1 | 12/2017 | Zhang et al. |
| 2018/0062041 | A1* | 3/2018 | Nakanishi ............. H01L 33/14 |
| 2019/0036308 | A1 | 1/2019 | Carson et al. |

FOREIGN PATENT DOCUMENTS

| | | |
|---|---|---|
| JP | H10-65277 A | 3/1998 |
| JP | 2003-195125 A | 7/2003 |
| JP | 2016-507167 A | 3/2016 |
| WO | 2018/009250 A1 | 1/2018 |
| WO | 2019/020395 A1 | 1/2019 |

OTHER PUBLICATIONS

Sep. 10, 2019 Written Opinion issued in International Patent Application No. PCT/JP2019/026709.
Mar. 7, 2023 Office Action issued in Japanese Patent Application No. 2019-056926.
Dec. 20, 2022 Extended European Search Report issued in European Patent Application No. 19921338.0.
Mar. 31, 2022 Office Action issued in Indian Patent Application No. 202147036655.
Feb. 22, 2024 Office Action issued in Indian Patent Application No. 202147036655.

* cited by examiner

LIGHT-EMITTING ELEMENT ARRAY CHIP, LIGHT-EMITTING DEVICE, OPTICAL DEVICE, AND INFORMATION PROCESSING DEVICE

CROSS-REFERENCE TO RELATED APPLICATIONS

This is a continuation of International Application No. PCT/JP2019/26709 filed on Jul. 4, 2019, and claims priority from Japanese Patent Application No. 2019-056926 filed on Mar. 25, 2019.

BACKGROUND

Technical Field

The present invention relates to a light-emitting element array chip, a light-emitting device, an optical device, and an information processing device.

Related Art

JP-T-2016-507167 discloses a laser diode drive system including a first high-side drive current source for driving a first set of diodes including one or more laser diodes, a second high-side drive current source for driving a second set of diodes including one or more laser diodes, an energy storage capacitor, and an energy storage capacitor charger for charging the energy storage capacitor.

US Patent Publication 10135222 discloses a VCSEL array in which a VCSEL array is divided into plural regions so that the farther the distance to a target object is, the more regions are emitted with light.

SUMMARY

Incidentally, in a light-emitting element array, from a viewpoint of improving power conversion efficiency, there is a method in which a lower distributed Bragg reflector is configured with a non-p-type semiconductor such as an n-type semiconductor or an i-type (intrinsic) semiconductor.

Further, in a case where the lower distributed Bragg reflector is configured with the non-p-type semiconductor and some light-emitting elements are driven independently of other light-emitting elements, there is a method in which a cathode electrode on a back surface side is used as a common electrode, an anode electrode on an emission surface side is separated by some light-emitting elements and other light-emitting elements, and each light-emitting element is driven on a high side.

When some light-emitting elements and other light-emitting elements are driven independently, a configuration enabling low-side drive instead of the high-side drive is desired from a viewpoint of improving a drive speed.

Aspects of non-limiting embodiments of the present disclosure relate to providing a light-emitting element array chip, a light-emitting element, an optical device, and an information processing device, which enables some light-emitting elements and other light-emitting elements to be driven independently on a low side in a light-emitting element array chip including a lower distributed Bragg reflector configured with a non-p-type semiconductor.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting element array chip including: a first light-emitting element array that includes a first light-emitting element including a first substrate, a light-emitting element layer formed on the first substrate, and a first cathode electrode electrically connected to the light-emitting element layer; and a second light-emitting element array that includes a second light-emitting element including a second substrate, a non-p-type lower reflector formed on the second substrate, and a second cathode electrode electrically connected to the non-p-type lower reflector, in which the first light-emitting element array is provided on an emission surface side of the second light-emitting element array.

BRIEF DESCRIPTION OF DRAWINGS

Exemplary embodiment(s) of the present invention will be described in detail based on the following figures, wherein.

DETAILED DESCRIPTION

Hereinafter, exemplary embodiments of the present invention will be described in detail with reference to the accompanying drawings.

In many cases, an information processing device identifies whether a user who has accessed the information processing device is permitted to access the information processing device, and permits use of the information processing device, which is the own device, only when it is authenticated that the user is permitted to access the information processing device. So far, a method of authenticating the user by a password, a fingerprint, an iris, or the like has been used. Recently, there is a demand for an authentication method having higher security. As this method, authentication based on a three-dimensional image such as a shape of a face of the user is performed.

Here, the information processing device will be described as a portable information processing terminal as an example, and will be described as authenticating the user by recognizing the shape of the face captured as the three-dimensional image. The information processing device may be applied to an information processing device such as a personal computer (PC) other than the portable information terminal.

Further, configurations, functions, methods, and the like described in the following exemplary embodiments may be applied to recognition of a three-dimensional shape other than the recognition of the face, and may also be applied to recognition of a shape of an object other than the face. Further, a distance to an object to be measured is not limited.

FIRST EXEMPLARY EMBODIMENT

Information Processing Device 1

Figure 1:
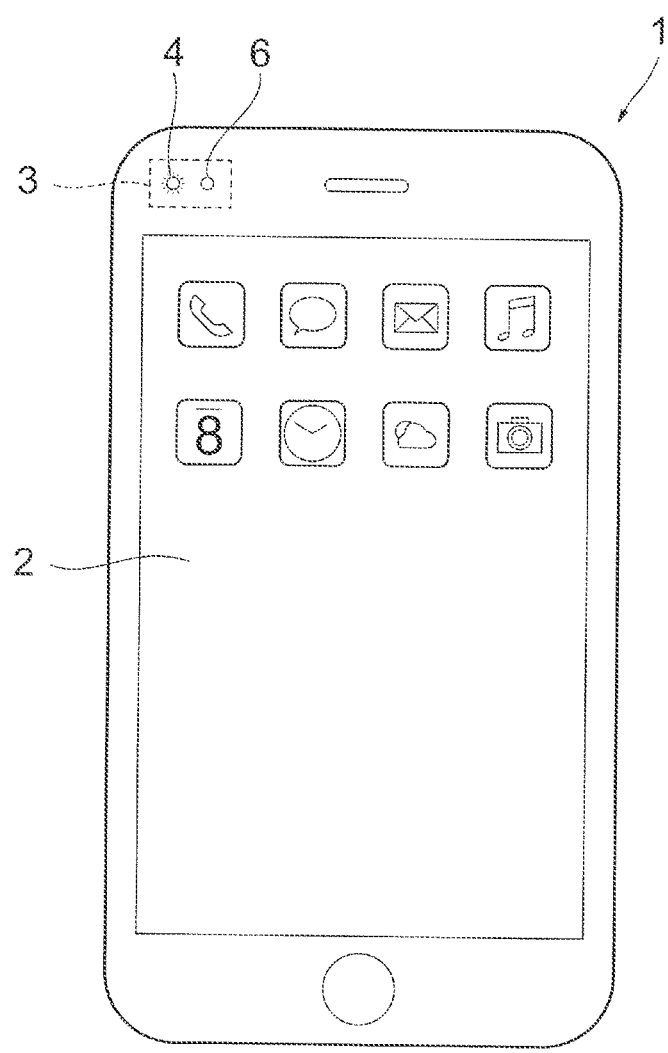
FIG. 1 is a diagram showing an example of an information processing device.

FIG. 1 is a diagram showing an example of the information processing device 1. As described above, the information processing device 1 is, for example, the portable information processing terminal.

The information processing device 1 includes a user interface unit (hereinafter, referred to as UI unit) 2 and an optical device 3 that acquires a three-dimensional image. The UI unit 2 is configured by integrating, for example, a display device that displays information to the user and an input device to which an instruction for information processing is input by an operation of the user. The display device is, for example, a liquid crystal display or an organic EL display. The input device is, for example, a touch panel.

The optical device 3 includes a light-emitting device 4 and a three-dimensional sensor (hereinafter, referred to as a 3D sensor) 6. The light-emitting device 4 emits light toward the object to be measured, that is, the face in the example described here, in order to acquire a three-dimensional image. The 3D sensor 6 acquires the light emitted by the light-emitting device 4, reflected by the face, and returned. Here, the three-dimensional image of the face is acquired based on a so-called time of flight (TOF) method based on flight time of light. Hereinafter, even when the object to be measured is the face, the object to be measured is simply referred to as an object to be measured.

The information processing device 1 is configured as a computer including a central processing unit (CPU), a read only memory (ROM), a random access memory (RAM), and the like. The ROM includes a non-volatile rewritable memory, for example, a flash memory. Then, programs and constants stored in the ROM are developed in the RAM and executed by the CPU, so that the information processing device 1 operates and various information processing is executed.

Figure 2:
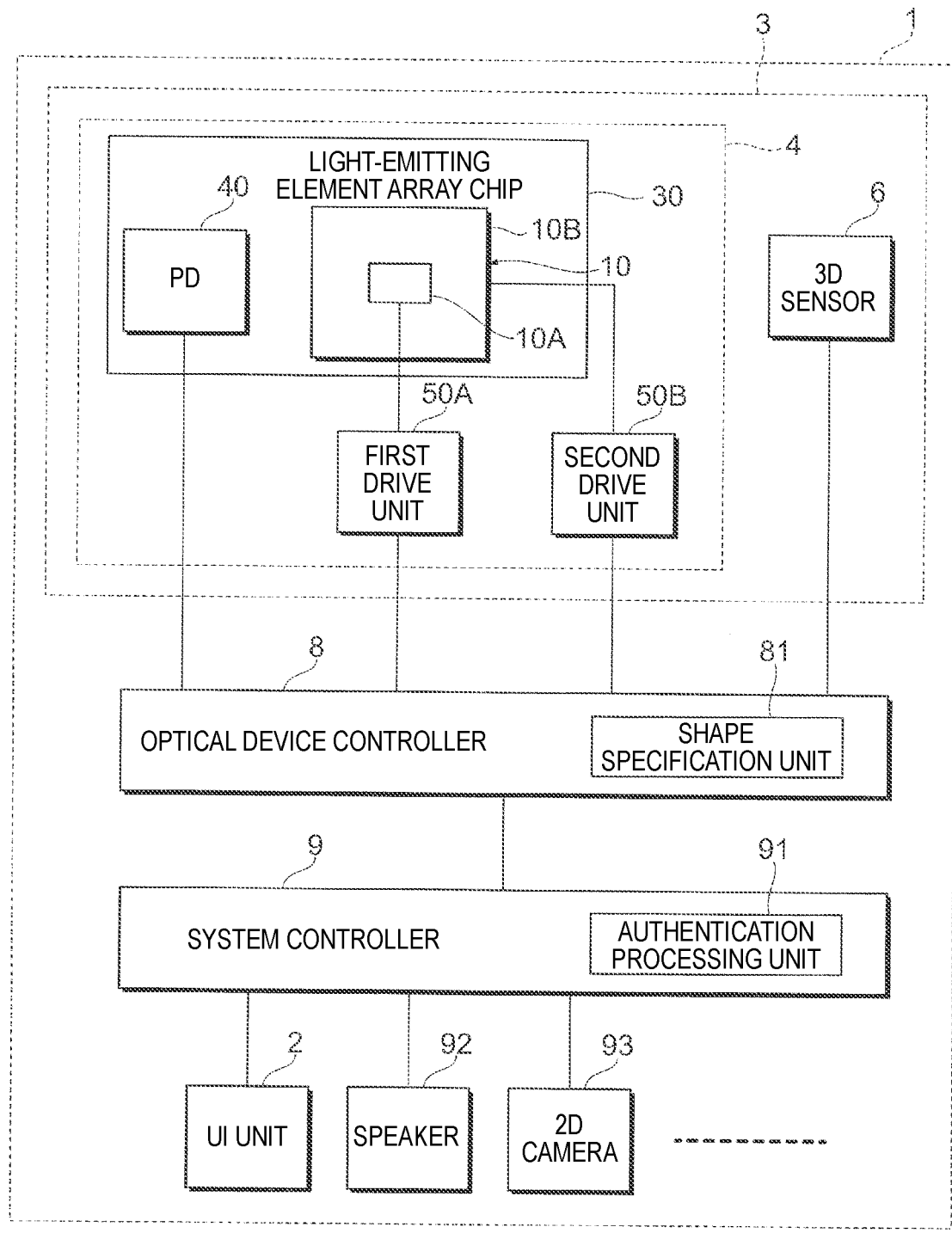
FIG. 2 is a block diagram illustrating a configuration of the information processing device.

FIG. 2 is a block diagram illustrating a configuration of the information processing device 1.

The information processing device 1 includes the above-described optical device 3, an optical device controller 8, and a system controller 9. As described above, the optical device 3 includes the light-emitting device 4 and the 3D sensor 6. The optical device controller 8 controls the optical device 3. The optical device controller 8 includes a shape specification unit 81. The system controller 9 controls the entire information processing device 1 as a system. The system controller 9 includes an authentication processing unit 91. The UI unit 2, a speaker 92, a two-dimensional (2D) camera 93, and the like are connected to the system controller 9. The light-emitting device 4 is an example of a light-emitting device. The 3D sensor 6 is an example of a light-receiving unit. Hereinafter, the above-described components will be described in order.

As described above, the optical device 3 includes the light-emitting device 4 and the 3D sensor 6. The light-emitting device 4 includes a light-emitting element array chip 10, a diffusion plate 30, a light-amount monitoring light-receiving element (hereinafter, also referred to as PD) 40, a first drive unit 50A, and a second drive unit 50B. The light-emitting element array chip 10 includes a low-power light-emitting element array 10A and a high-power light-emitting element array 10B. Here, the low-power light-emitting element array 10A and the high-power light-emitting element array 10B each include plural light-emitting elements arranged therein. The low-power light-emitting element array 10A is an example of a first light-emitting element array, and the high-power light-emitting element array 10B is an example of a second light-emitting element array. The diffusion plate 30 will be described later. The diffusion plate 30 is an example of a light diffusion member.

The first drive unit 50A of the light-emitting device 4 drives the low-power light-emitting element array 10A, and the second drive unit 50B of the light-emitting device 4 drives the high-power light-emitting element array 10B. For example, the low-power light-emitting element array 10A and the high-power light-emitting element array 10B are driven to emit pulsed light of several tens of MHz to several hundreds of MHz. The emitted pulsed light is referred to as an emitted light pulse. As will be described later, the optical device 3 is configured such that light emitted from the light-emitting element array chip 10 toward the object to be measured and reflected from the object to be measured is received by the 3D sensor 6.

The 3D sensor 6 includes plural light-receiving regions 61 (see FIG. 6 described later). The 3D sensor 6 outputs a signal corresponding to time required for light emitted from the low-power light-emitting element array 10A to be reflected by the object to be measured and received by the 3D sensor 6, and a signal corresponding to time required for light emitted from the high-power light-emitting element array 10B to be reflected by the object to be measured and received by the 3D sensor 6. The 3D sensor 6 may include a condensing lens.

The light emitted from the low-power light-emitting element array 10A and reflected by the object to be measured is an example of first reflected light, and the light emitted from the high-power light-emitting element array 10B and reflected by the object to be measured is an example of second reflected light.

The shape specification unit 81 of the optical device controller 8 acquires a digital value obtained for each light-receiving region 61 from the 3D sensor 6 and calculates a distance to the object to be measured for each light-receiving region 61 to specify a 3D shape of the object to be measured.

The authentication processing unit 91 of the system controller 9 performs an authentication processing related to use of the information processing device 1 when the 3D shape of the object to be measured that is a specification result specified by the shape specification unit 81 is a 3D shape stored in advance in the ROM or the like. The authentication processing related to the use of the information processing device 1 is, for example, a processing of determining whether to permit the use of the own device (the information processing device 1). For example, when the 3D shape of the face that is the object to be measured coincides with the face shape stored in a storage member such as the ROM, the use of the information processing device 1 including various applications and the like provided by the information processing device 1 is permitted.

The shape specification unit 81 and the authentication processing unit 91 each are configured with, for example, a program. Further, the shape specification unit 81 and the authentication processing unit 91 each may be configured with an integrated circuit such as an ASIC (Application Specific Integrated Circuit) or an FPGA (Field-Programmable Gate Array). The shape specification unit 81 and the authentication processing unit 91 each may be configured with software such as a program and the integrated circuit.

In FIG. 2, the optical device 3, the optical device controller 8, and the system controller 9 are separately shown, but the system controller 9 may include the optical device controller 8. Further, the optical device controller 8 may be included in the optical device 3. Furthermore, the optical device 3, the optical device controller 8, and the system controller 9 may be integrally configured.

Overall Configuration of Optical Device 3

Next, the optical device 3 will be described in detail.

Figure 3A:
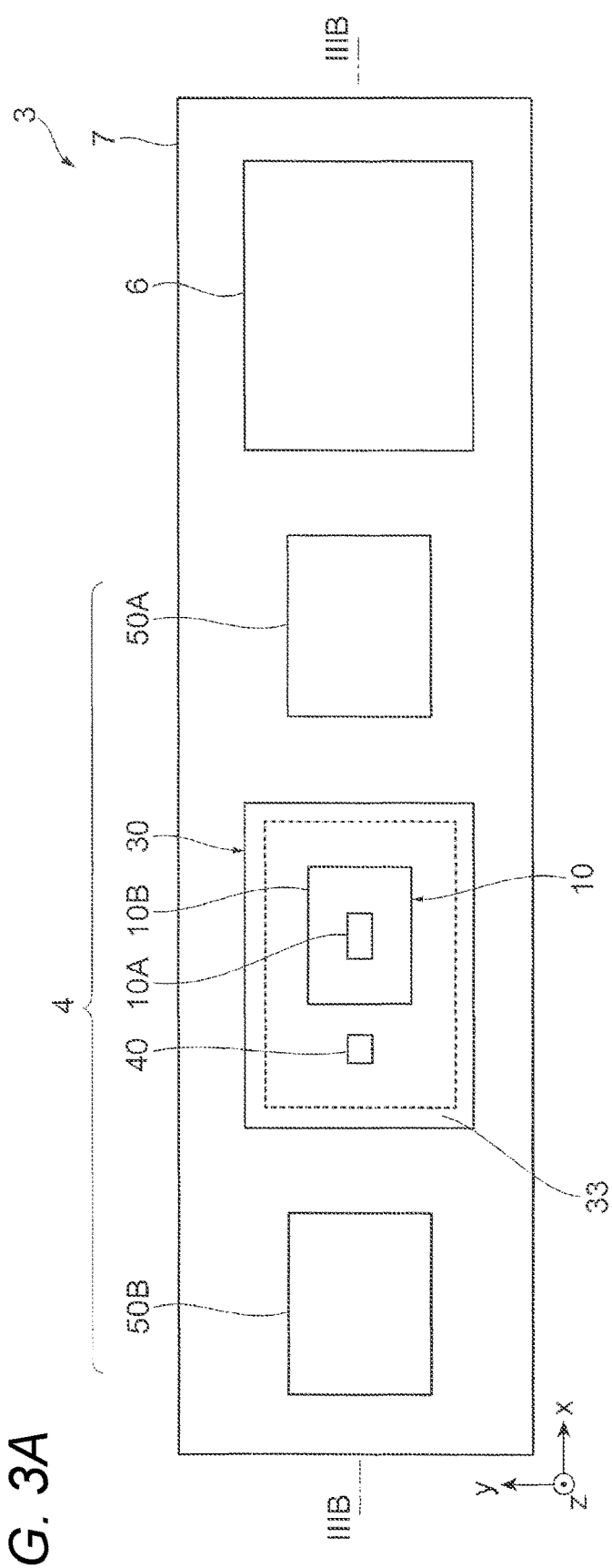
FIG. 3A shows an example of a plan view of an optical device.
Figure 3B:
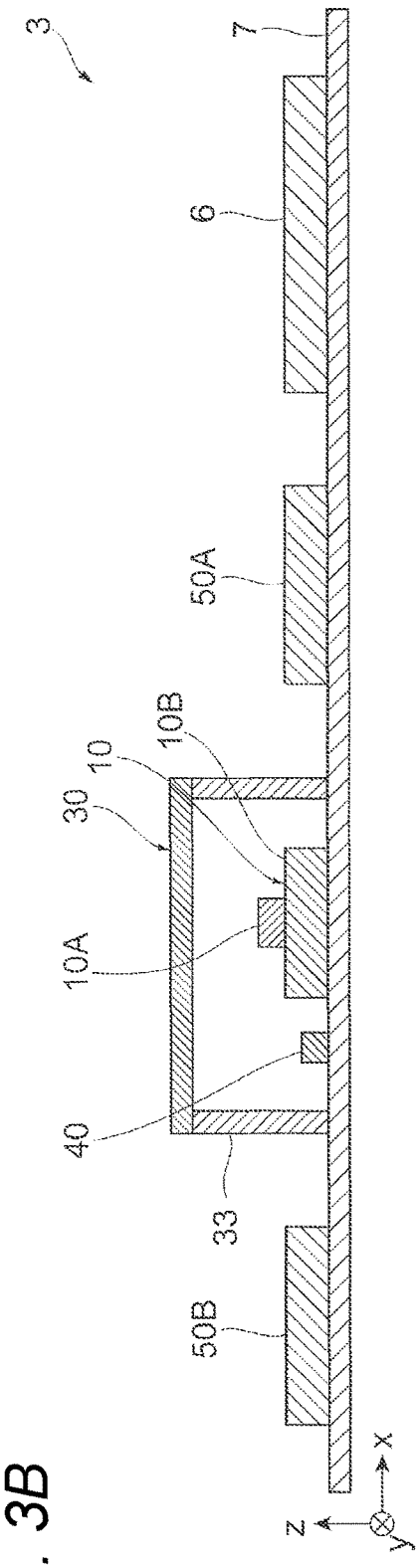
FIG. 3B shows an example of a cross-sectional view taken along a line IIIB-IIIB in FIG. 3A.

FIGS. 3A and 3B show an example of a plan view and a cross-sectional view of the optical device 3. FIG. 3A is a plan view, and FIG. 3B is a cross-sectional view taken along a line IIIB-IIIB in FIG. 3A. Here, in FIG. 3A, a lateral direction of a paper surface is defined as an x direction, an upward direction of the paper surface is defined as a y direction, and a direction orthogonal to the x direction and the y direction counterclockwise is defined as a z direction.

As shown in FIG. 3A, in the optical device 3, the light-emitting device 4 and the 3D sensor 6 are arranged in the x direction on the circuit substrate 7. The circuit substrate 7 uses a plate-shaped member made of an insulation material as a base material, and is provided with conductor patterns made of a conductive material. The insulation material is, for example, ceramic or epoxy resin. The conductive material is, for example, a metal such as copper (Cu) or silver (Ag), or a conductive paste containing these metals. The circuit substrate 7 may be a single-layer substrate having the conductor patterns provided on a front surface thereof, or may be a multilayer substrate having plural layers of conductor patterns.

In the light-emitting device 4, as an example, the second drive unit 50B, the light-amount monitoring light-receiving element 40, the light-emitting element array chip 10, and the first drive unit 50A are arranged in order in the +x direction on the circuit substrate 7. The low-power light-emitting element array 10A is disposed on the high-power light-emitting element array 10B. That is, the low-power light-emitting element array 10A is disposed to be laminated on a central region of the high-power light-emitting element array 10B. Here, the low-power light-emitting element array 10A and the high-power light-emitting element array 10B are manufactured as separate semiconductor chips, and the low-power light-emitting element array 10A is adhered onto the high-power light-emitting element array 10B to constitute the light-emitting element array chip 10. The low-power light-emitting element array 10A and the high-power light-emitting element array 10B emit light in the same direction (the z direction in FIG. 3B). The high-power light-emitting element array 10B may be directly mounted on the circuit substrate 7, or may be mounted on the circuit substrate 7 with a heat dissipation base material such as aluminum oxide or aluminum nitride interposed therebetween.

The first drive unit 50A that drives the low-power light-emitting element array 10A and the second drive unit 50B that drives the high-power light-emitting element array 10B are arranged on the circuit substrate 7 at positions facing each other with the light-emitting element array chip 10 sandwiched therebetween.

The light-amount monitoring light-receiving element 40 is disposed on the circuit substrate 7 at a position close to the high-power light-emitting element array 10B, that is, between the high-power light-emitting element array 10B and the second drive unit 50B.

As shown in FIG. 3B, the diffusion plate 30 is provided by a predetermined distance from the light-emitting element array chip 10 via a spacer 33 on a light emission direction side of the light-emitting element array chip 10, that is, on a light emission path. The diffusion plate 30 is provided so as to cover the light-emitting element array chip 10 and the light-amount monitoring light-receiving element 40.

The diffusion plate 30 includes, for example, a resin layer in which irregularities for diffusing light are formed on one front surface of a flat glass base material having both surfaces parallel to each other. The diffusion plate 30 further widens a spread angle of light incident on the diffusion plate 30 and emits the light from the diffusion plate 30. Since spread angles of lights emitted from light-emitting elements provided in the low-power light-emitting element array 10A and the high-power light-emitting element array 10B of the light-emitting element array chip 10 are widened by the diffusion plate 30, an irradiation surface irradiated with the lights is widened as compared with a case where the diffusion plate 30 is not provided.

The light-amount monitoring light-receiving element 40 is, for example, a photodiode (PD) made of silicon or the like that outputs an electric signal corresponding to a light-receiving amount.

The light-amount monitoring light-receiving element 40 receives the lights emitted from the low-power light-emitting element array 10A and the high-power light-emitting element array 10B and reflected by a back surface (a surface in the −z direction) of the diffusion plate 30.

In the light-emitting device 4, the low-power light-emitting element array 10A is driven by the first drive unit 50A to emit light to the object to be measured. The high-power light-emitting element array 10B is driven by the second drive unit 50B to emit light to the object to be measured at a light intensity stronger than that of the light emitted by the low-power light-emitting element array 10A. The light-amount monitoring light-receiving element 40 receives lights reflected by the diffusion plate 30 among the lights emitted from the low-power light-emitting element array 10A and the high-power light-emitting element array 10B, and monitors an intensity of the lights emitted from the low-power light-emitting element array 10A and the high-power light-emitting element array 10B. Then, based on the intensity of the lights emitted from the low-power light-emitting element array 10A and the high-power light-emitting element array 10B monitored by the light-amount monitoring light-receiving element 40, the intensity of the lights emitted from the low-power light-emitting element array 10A and the high-power light-emitting element array 10B is controlled via the first drive unit 50A and the second drive unit 50B.

When an amount of the lights received by the light-amount monitoring light-receiving element 40 is extremely low, the diffusion plate 30 may be detached or damaged, and therefore the light emitted from the low-power light-emitting element array 10A or the high-power light-emitting element array 10B may be directly emitted to an outside without being diffused. In such a case, emission of the light from the low-power light-emitting element array 10A or the high-power light-emitting element array 10B is prevented by the first drive unit 50A or the second drive unit 50B via the optical device controller 8. For example, the irradiation of the light(s) from one or both of the low-power light-emitting element array 10A and the high-power light-emitting element array 10B is stopped.

Configuration of Light-Emitting Element Array Chip 10

Figure 4:
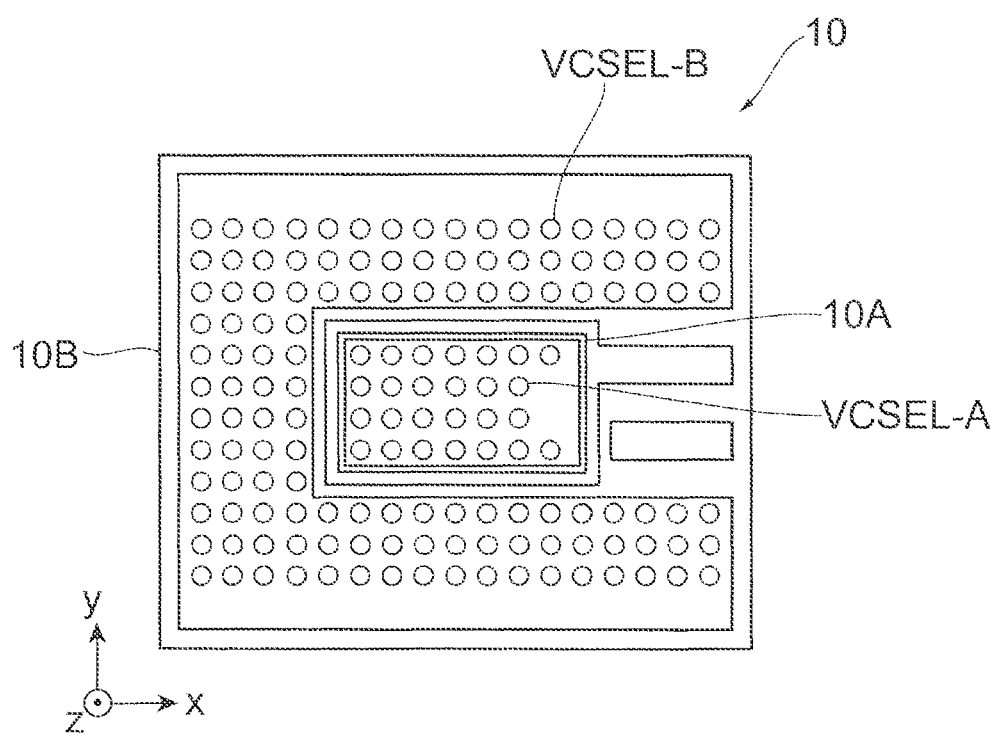
FIG. 4 is a diagram illustrating a configuration of a light-emitting element array chip.

FIG. 4 is a diagram illustrating a configuration of the light-emitting element array chip 10. As described above, in the light-emitting element array chip 10, the low-power light-emitting element array 10A is provided on the high-power light-emitting element array 10B. Here, the low-power light-emitting element array 10A and the high-power light-emitting element array 10B both have a rectangular surface shape. The surface shapes of the low-power light-emitting element array 10A and the high-power light-emitting element array 10B may not be rectangular. The low-power light-emitting element array 10A of the light-emitting element array chip 10 includes vertical cavity surface emitting laser elements VCSEL-As as examples of a light-emitting element. On the other hand, the high-power light-emitting element array 10B includes vertical cavity surface emitting laser elements VCSEL-Bs as examples of the light-emitting element. Hereinafter, the vertical cavity surface emitting laser element VCSEL-A is referred to as VCSEL-A, and the vertical cavity surface emitting laser element VCSEL-B is referred to as VCSEL-B. When the VCSEL-A and the VCSEL-B are not distinguished from each other, they are referred to as VCSEL. The VCSEL-A is an example of a first light-emitting element, and the VCSEL-B is an example of a second light-emitting element.

The VCSEL is a light-emitting element in which an active region serving as a light-emitting region is provided between a lower multilayer film reflector and an upper multilayer film reflector laminated on a substrate, and that emits laser light in a direction perpendicular to the substrate. Therefore, the VCSELs are easily formed into a two-dimensional array. In the example shown in FIG. 4, the low-power light-emitting element array 10A includes plural VCSEL-As, and the high-power light-emitting element array 10B also includes plural VCSEL-Bs. Here, the plural VCSEL-As of the low-power light-emitting element array 10A and the plural VCSEL-Bs of the high-power light-emitting element array 10B are arranged at equal intervals in the x direction and the y direction. The VCSEL-As and the VCSEL-Bs may be arranged in a different manner from the above.

The low-power light-emitting element array 10A is provided in the central region of the high-power light-emitting element array 10B. That is, the VCSEL-As of the low-power light-emitting element array 10A are surrounded on three sides by the VCSEL-Bs of the high-power light-emitting element array 10B.

The VCSEL-As of the low-power light-emitting element array 10A emit lights when, for example, the object to be measured is close to the information processing device 1. On the other hand, the VCSEL-Bs of the high-power light-emitting element array 10B emit lights when, for example, the object to be measured is not close to the information processing device 1. That is, when the object to be measured is close to the information processing device 1, only the low-power light-emitting element array 10A is driven because a light intensity stronger than necessary is not required.

Further, when the object to be measured is not close to the information processing device 1, that is, when a light intensity of the low-power light-emitting element array 10A is insufficient, the high-power light-emitting element array 10B is driven. Furthermore, when a light intensity is insufficient only with the high-power light-emitting element array 10B, both the low-power light-emitting element array 10A and the high-power light-emitting element array 10B are driven. According to such a configuration, power consumption is suppressed as compared with a configuration in which the low-power light-emitting element array 10A and the high-power light-emitting element array 10B are not distinguished and light is always emitted at a constant light intensity. That is, when the information processing device 1 is a portable information terminal, a decrease in a charge amount of a battery is prevented.

The number of VCSEL-As that constitute the low-power light-emitting element array 10A and the number of VCSEL-Bs that constitute the high-power light-emitting element array 10B are 1 or more and 1000 or less. Then, the number of VCSEL-Bs of the high-power light-emitting element array 10B is set to be larger than the number of VCSEL-As of the low-power light-emitting element array 10A. When the plural VCSEL-As are used in the low-power light-emitting element array 10A, the VCSEL-As are connected in parallel to each other and driven in parallel. Also, when the plural VCSEL-Bs are used in the high-power light-emitting element array 10B, the VCSEL-Bs are connected in parallel to each other and driven in parallel. The low-power light-emitting element array 10A may include one VCSEL-A, and the high-power light-emitting element array 10B may include one VCSEL-B.

The number of VCSELs described above is an example, and may be set in accordance with a measurement distance or a measurement range.

Hereinafter, the VCSEL-As that constitute the low-power light-emitting element array 10A and the VCSEL-Bs that constitute the high-power light-emitting element array 10B will be described. The VCSEL-A and the VCSEL-B have similar structures. First, a structure of the VCSEL will be described for the VCSEL-As provided in the low-power light-emitting element array 10A. An oscillation mode of the VCSEL-A and the VCSEL-B may be either a single mode or a multimode. In the following description, a non-p-type semiconductor (sometimes referred to as non-p-type) means an n-type semiconductor doped with an n-type impurity or an i-type (intrinsic) semiconductor not doped (that is, undoped) with an impurity.

Figure 5A:
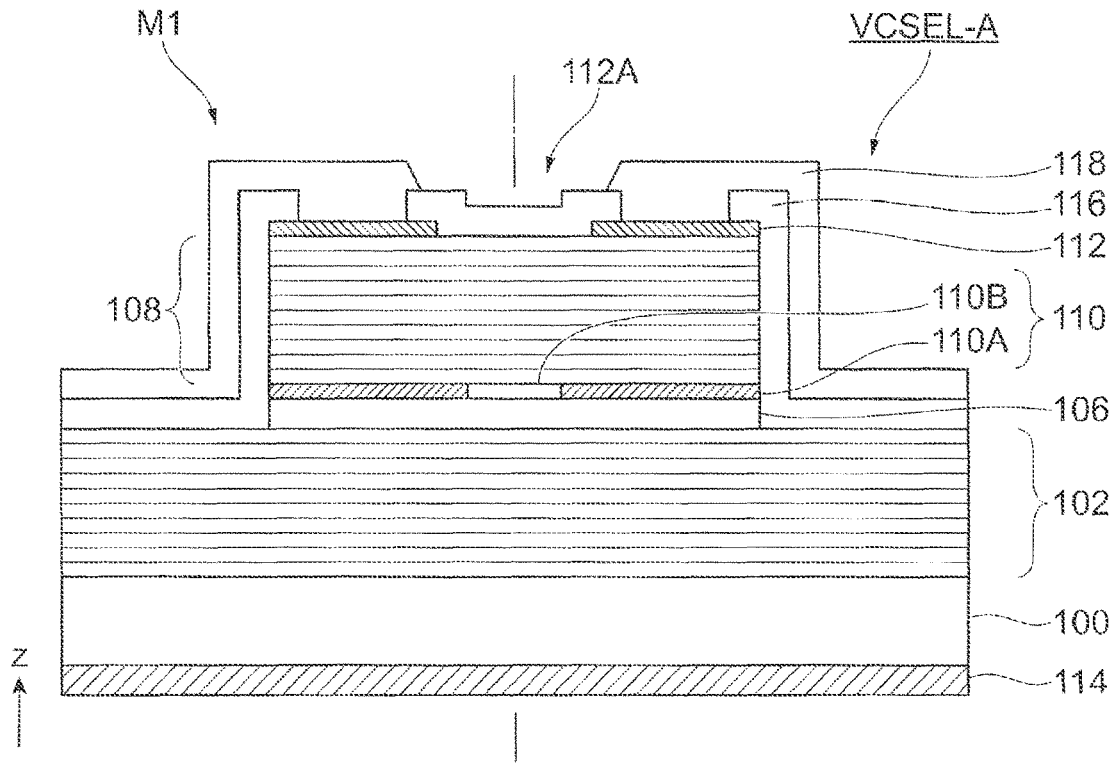
FIG. 5A shows diagrams illustrating cross-sectional structure of one VCSEL of a low-power light-emitting element array.
Figure 5B:
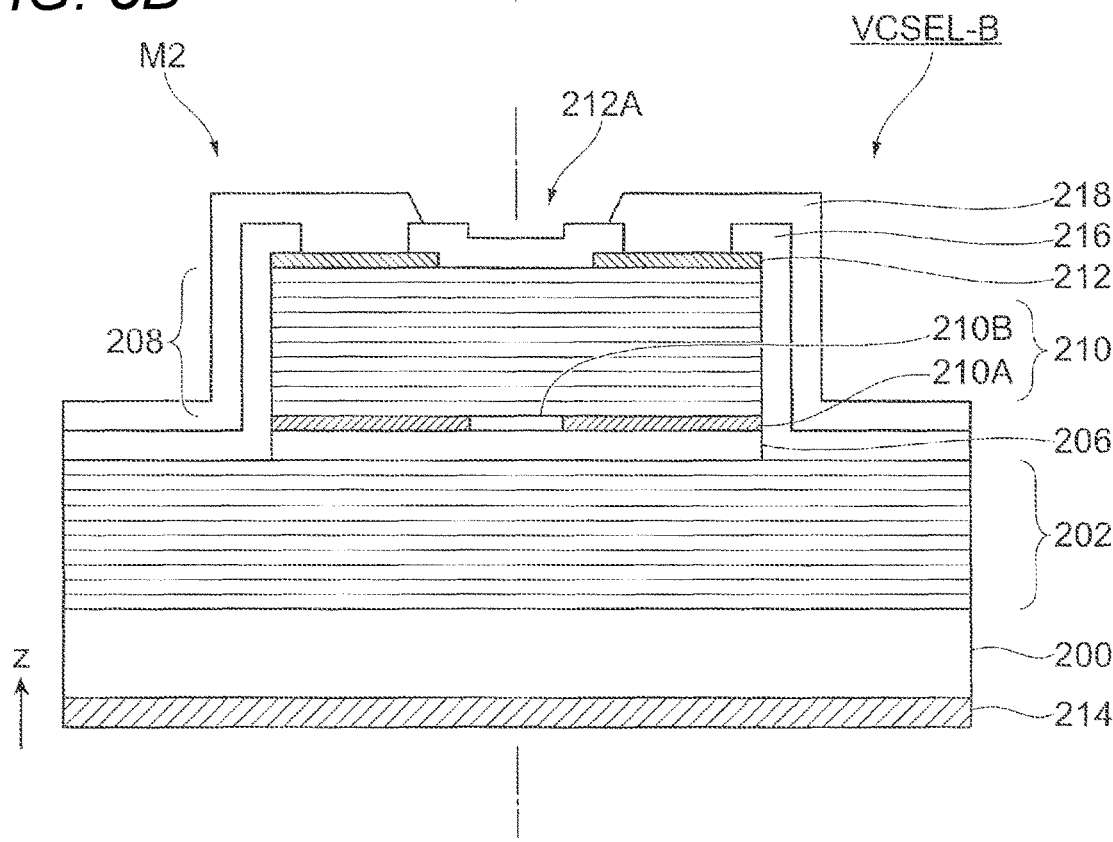
FIG. 5B shows diagrams illustrating cross-sectional structure of one VCSEL of a high-power light-emitting element array.

FIGS. 5A and 5B shows diagrams illustrating cross-sectional structures of the VCSELs. FIG. 5A shows one VCSEL-A of the low-power light-emitting element array 10A, and FIG. 5B shows one VCSEL-B of the high-power light-emitting element array 10B. In FIGS. 5A and 5B, an upward direction of a paper surface is the z direction.

The VCSEL-A shown in FIG. 5A is configured by laminating, on an n-type GaAs substrate 100, an n-type lower distributed Bragg reflector (DBR) 102 in which AlGaAs layers having different Al compositions are alternately laminated, an active region 106 that is formed on the lower DBR 102 and includes a quantum well layer sandwiched between an upper spacer layer and a lower spacer layer, and a p-type upper DBR 108 that is formed on the active region 106 and in which AlGaAs layers having different Al compositions are alternately laminated. A p-type AlAs current confinement layer 110 is formed on a lowermost layer of the upper DBR 108 or in the upper DBR 108. The substrate 100 is an example of a first substrate. The active region 106 is an example of a light-emitting element layer of the first light-emitting element.

The n-type lower DBR 102 is a multi-layer laminated body in which an $Al_{0.9}Ga_{0.1}As$ layer and a GaAs layer are paired. A thickness of each layer is $\lambda/4n_r$ (where $\lambda$ is an oscillation wavelength and $n_r$ is a refractive index of a medium), and these layers are alternately laminated in 40 cycles. A carrier concentration after doping silicon that is an n-type impurity is, for example, $3\times10^{18}$ cm$^{-3}$.

The active region 106 is formed by laminating a lower spacer portion, a quantum well active layer, and an upper spacer layer. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 108 is a laminated body of a p-type $Al_{0.9}Ga_{0.1}As$ layer and a GaAs layer. A thickness of each layer is $\lambda/4n_r$, and these layers are alternately laminated in 29 cycles. A carrier concentration after doping carbon that is a p-type impurity is, for example, $3\times10^{18}$ cm$^{-3}$. A contact layer made of p-type GaAs may be formed on an uppermost layer of the upper DBR 108, and the p-type AlAs current confinement layer 110 may be formed on the lowermost layer of the upper DBR 108 or in the upper DBR 108.

The semiconductor layers laminated from the upper DBR 108 to the lower DBR 102 are etched, so that a columnar mesa M1 is formed on the substrate 100. Then, the current confinement layer 110 is exposed on a side surface of the mesa M1. In the current confinement layer 110, an oxidized region 110A selectively oxidized from the side surface of the mesa M1 and a conductive region 110B surrounded by the oxidized region 110A are formed. In an oxidation step, an oxidation rate of an AlAs layer is higher than that of the AlGaAs layer, and the oxidized region 110A is oxidized at a substantially constant rate from the side surface of the mesa M1 toward an inside. Therefore, a planar shape of the conductive region 110B parallel to the substrate 100 is a shape that reflects an outer shape of the mesa M1, that is, a circular shape, and a center thereof substantially coincides with a central axis direction of the mesa M1 indicated by a dashed-dotted line.

An annular p-side electrode 112 made of metal in which Ti/Au or the like is laminated is formed on an uppermost layer of the mesa M1. The p-side electrode 112 is in ohmic contact with the contact layer of the upper DBR 108. An inner inside of the annular p-side electrode 112 serves as a light-emission port 112A through which the laser light is emitted to an outside. That is, the central axis direction of the mesa M1 is an optical axis. Further, a cathode electrode 114 is formed as an n-side electrode on a back surface of the substrate 100. An inner surface of the p-side electrode 112, which is the light-emission port 112A, is an emission surface.

An insulation layer 116 is provided so as to cover a surface of the mesa M1 except for a portion where the p-side electrode 112 and an anode electrode 118 described later are connected and the light-emission port 112A. Except for the light-emission port 112A, the anode electrode 118 is provided so as to be in ohmic contact with the p-side electrode 112. The anode electrode 118 is provided except for the light-emission port 112A of the VCSEL-A. That is, in the VCSEL-A, the p-side electrode 112 is connected to the anode electrode 118. When the plural VCSEL-As are used, the p-side electrodes 112 of the VCSEL-As are connected to the anode electrodes 118 in parallel. Here, the cathode electrode 114 is an example of a first cathode electrode electrically connected to the active region 106 that is an example of the light-emitting element layer of the first light-emitting element, and the anode electrode 118 is an example of a first anode electrode.

The VCSEL-B shown in FIG. 5B is configured by laminating, on an n-type GaAs substrate 200, an n-type lower DBR 202 in which AlGaAs layers having different Al compositions are alternately laminated, an active region 206 that is formed on the lower DBR 202 and includes a quantum well layer sandwiched between an upper spacer layer and a lower spacer layer, and a p-type upper DBR 208 that is formed on the active region 206 and in which AlGaAs layers having different Al compositions are alternately laminated. A p-type AlAs current confinement layer 210 is formed on a lowermost layer of the upper DBR 208 or in the upper DBR 208. The substrate 200 is an example of a second substrate, and the n-type lower DBR 202 is an example of a non-p-type lower reflector.

Since the lower DBR 202, the active region 206, the upper DBR 208, and the current confinement layer 210 are the same as the lower DBR 102, the active region 106, the upper DBR 108, and the current confinement layer 110 of the VCSEL-A described above, description thereof will be omitted.

The semiconductor layers laminated from the upper DBR 208 to the lower DBR 202 are etched, so that a columnar mesa M2 is formed on the substrate 200. In the current confinement layer 210 exposed on a side surface of the mesa M2, an oxidized region 210A selectively oxidized from the side surface of the mesa M2 and a conductive region 210B surrounded by the oxidized region 210A are formed. A planar shape of the conductive region 210B parallel to the substrate 200 is a shape that reflects an outer shape of the mesa M2, that is, a circular shape, and a center thereof substantially coincides with a central axis direction of the mesa M2.

An annular p-side electrode 212 made of metal in which Ti/Au or the like is laminated is formed on an uppermost layer of the mesa M2, and the p-side electrode 212 is in ohmic contact with a contact layer of the upper DBR 208. An inner inside of the annular p-side electrode 212 serves as a light-emission port 212A through which the laser light is emitted to an outside. That is, the central axis direction of the mesa M2 is an optical axis. Further, a cathode electrode 214 serving as an n-side electrode is formed on a back surface of the substrate 200. An inner surface of the p-side electrode 212, which is the light-emission port 212A, is an emission surface. Here, the cathode electrode 214 is an example of a second cathode electrode electrically connected to the active region 206 that is an example of a light-emitting element layer of the second light-emitting element, and an anode electrode 218 is an example of a second anode electrode.

An insulation layer 216 is provided so as to cover a surface of the mesa M2 except for a portion where the p-side electrode 212 and the anode electrode 218 described later are connected and the light-emission port 212A. Then, the anode electrode 218 is provided so as to be in ohmic contact with the p-side electrode 212 except for the light-emission port 212A. The anode electrode 218 is provided except for the light-emission port 212A of the VCSEL-B. That is, in the VCSEL-B, the p-side electrode 212 is connected to the anode electrode 218. When the plural VCSEL-Bs are used, the p-side electrodes 212 of the VCSEL-Bs are connected to the anode electrodes 218 in parallel.

As will be described later, on the insulation layer 216, in addition to the anode electrode 218, a cathode wire 219 to which the cathode electrode 114 of the low-power light-emitting element array 10A is adhered, and an anode wire 220 that relays connection of the anode electrode 118 of the low-power light-emitting element array 10A are provided. A cathode pad 219A is connected to the cathode wire 219. An anode pad 220A is connected to the anode wire 220. Since being provided on the insulation layer 216, the cathode wire 219, the cathode pad 219A, the anode wire 220, and the anode pad 220A do not influence an operation of the VCSEL-B. The cathode wire 219, the cathode pad 219A, the anode wire 220, and the anode pad 220A are provided on an emission surface side of the VCSEL-B. The cathode electrode 114 of the low-power light-emitting element array 10A is adhered onto the cathode wire 219 with a conductive material such as a conductive adhesive. The conductive adhesive is an example of an adhesive member.

Configuration of 3D Sensor 6

Figure 6:
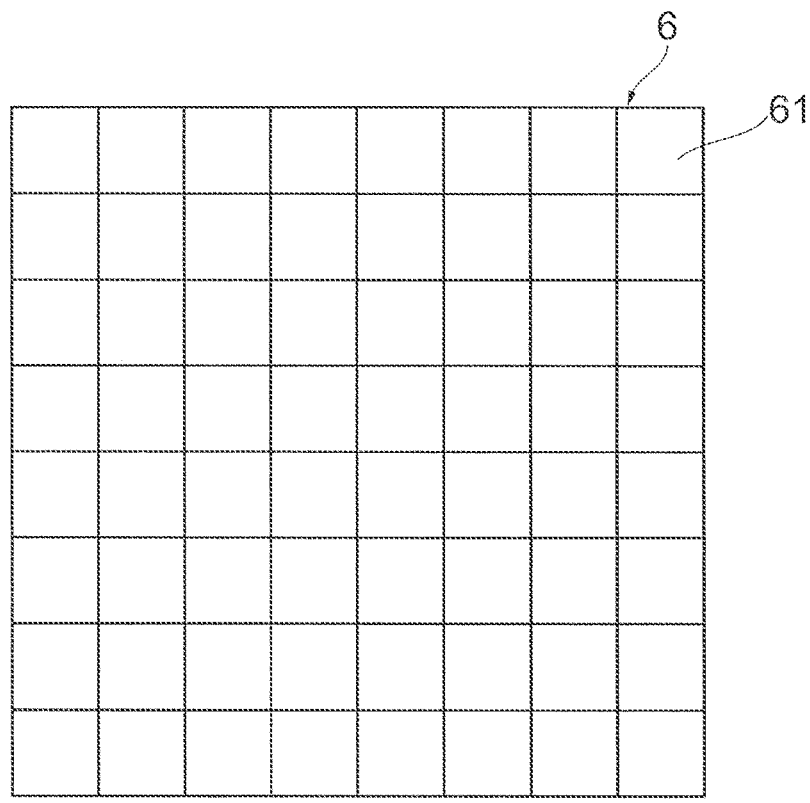
FIG. 6 is a diagram illustrating a 3D sensor.

FIG. 6 is a diagram illustrating the 3D sensor 6.

The 3D sensor 6 is configured by arranging the plural light-receiving regions 61 in a lattice shape. The 3D sensor 6 receives a light-receiving pulse that is reflected light from the object to be measured with respect to an emitted light pulse from the light-emitting device 4, and accumulates, in the light-receiving regions 61, electric charge corresponding to a time until the light-receiving pulse is received. As an example, the 3D sensor 6 is configured as a device having a CMOS structure in which each light-receiving region 61 includes two gates and electric charge accumulation portions corresponding to the gates. The 3D sensor 6 is configured to, by alternately applying pulses to the two gates, transfer generated photoelectrons to one of the two electric charge accumulation portions at high speed, and accumulate electric charge corresponding to a phase difference between the emitted light pulse and the light-receiving pulse. Then, a digital value corresponding to electric charge corresponding to the phase difference between the emitted light pulse and the light-receiving pulse for each light-receiving region 61 is output as a signal via an AD converter. That is, the 3D sensor 6 outputs a signal corresponding to a time from when light is emitted from the low-power light-emitting element array 10A to when the light is received by the 3D sensor 6, and a signal corresponding to a time from when light is emitted from the high-power light-emitting element array 10B to when the light is received by the 3D sensor 6.

Connection Relationship Between Light-Emitting Element Array Chip 10 and Circuit Substrate 7

Next, a connection relationship between the light-emitting element array chip 10 and the conductor patterns provided on the circuit substrate 7 will be described.

Figure 7:
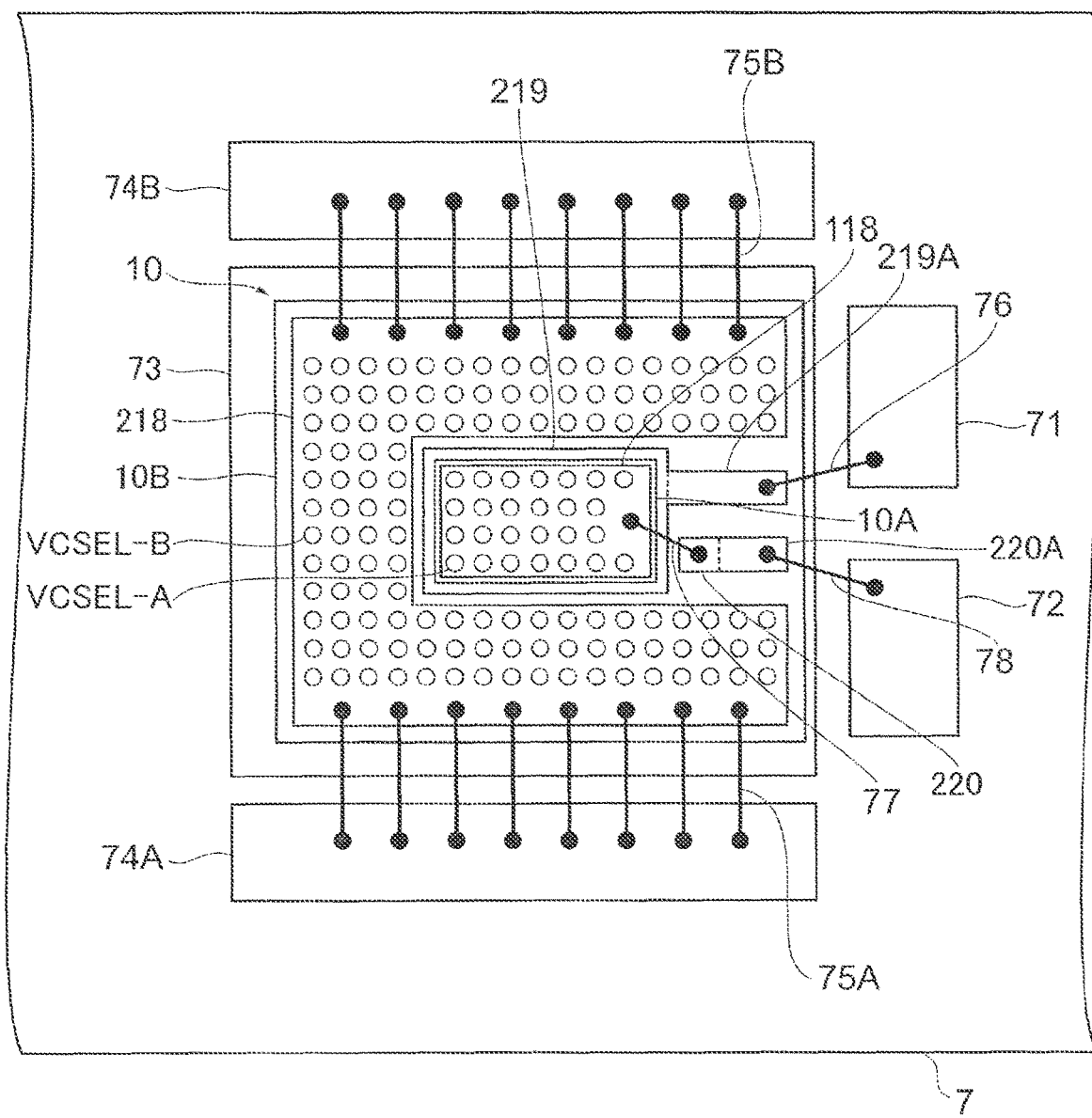
FIG. 7 is a diagram illustrating a connection relationship between the light-emitting element array chip and conductor patterns provided on a circuit substrate.

FIG. 7 is a diagram illustrating the connection relationship between the light-emitting element array chip 10 and the conductor patterns provided on the circuit substrate 7.

On the circuit substrate 7, as the conductor patterns, a cathode pattern 71 and an anode pattern 72 for the low-power light-emitting element array 10A and a cathode pattern 73 and anode patterns 74A and 74B for the high-power light-emitting element array 10B are provided.

As described above, in the low-power light-emitting element array 10A, the cathode electrode 114 is provided on the back surface, and the anode electrode 118 is provided on the front surface (see FIG. 5A). The anode electrode 118 is formed so as to connect the p-side electrode 112 of the VCSEL-A, and includes a pad region to which a bonding wire 77 described later is connected.

Similarly, in the high-power light-emitting element array 10B, the cathode electrode 214 is provided on the back surface, and the anode electrode 218 is provided on the front surface (see FIG. 5B). The anode electrode 218 is formed along three sides of the low-power light-emitting element array 10A on which the VCSEL-Bs are arranged so as to connect the p-side electrode 212 of the VCSEL-B. The anode electrode 218 includes a pad region to which bonding wires 75A and 75B are connected on a ±y direction side. Further, the cathode wire 219 for the low-power light-emitting element array 10A and the anode wire 220 that relays the connection with the anode electrode 118 of the low-power light-emitting element array 10A are provided on the front surface of the high-power light-emitting element array 10B. The cathode pad 219A connected to the cathode wire 219 and the anode pad 220A connected to the anode wire 220 are also provided in a similar manner. The cathode wire 219, the cathode pad 219A, the anode wire 220, and the anode pad 220A are provided around the low-power light-emitting element array 10A on one side of the high-power light-emitting element array 10B where the VCSEL-Bs are not provided. The cathode wire 219 is formed to have an area larger than that of the low-power light-emitting element array 10A such that the cathode electrode 114 provided on the back surface of the low-power light-emitting element array 10A is connected.

The cathode pattern 73 for the high-power light-emitting element array 10B is formed to have an area larger than that of the high-power light-emitting element array 10B such that the cathode electrode 214 provided on the back surface of the high-power light-emitting element array 10B is connected. The high-power light-emitting element array 10B is adhered onto the cathode pattern 73 with a conductive adhesive or the like.

The anode patterns 74A and 74B for the high-power light-emitting element array 10B are provided so as to face two facing sides on the ±y direction side of the anode electrode 218 (see FIG. 5B) provided on the front surface of the high-power light-emitting element array 10B. The anode patterns 74A and 74B and the anode electrode 218 of the high-power light-emitting element array 10B are connected by the bonding wires 75A and 75B.

In the low-power light-emitting element array 10A, the cathode electrode 114 provided on the back surface and the cathode wire 219 for the low-power light-emitting element array 10A provided on the front surface of the high-power light-emitting element array 10B are adhered to each other by a conductive adhesive. The cathode pad 219A connected to the cathode wire 219 provided on the front surface of the high-power light-emitting element array 10B and the cathode pattern 71 for the low-power light-emitting element array 10A on the circuit substrate 7 are connected by the bonding wire 76. On the other hand, the anode electrode 118 provided on the front surface of the low-power light-emitting element array 10A and the anode wire 220 provided on the front surface of the high-power light-emitting element array 10B are connected by the bonding wire 77. Then, the anode pad 220A of the anode wire 220 and the anode pattern 72 for the low-power light-emitting element array 10A on the circuit substrate 7 are connected by the bonding wire 78.

When the anode electrode 118 of the low-power light-emitting element array 10A and the anode pattern 72 on the circuit substrate 7 are connected to each other via the anode wire 220, a length of the bonding wire becomes shorter than that in a case where the anode wire 220 is not used. When the low-power light-emitting element array 10A is disposed in the central region of the high-power light-emitting element array 10B, if the anode electrode 118 of the low-power light-emitting element array 10A and the anode pattern 72 on the circuit substrate 7 are directly connected by a bonding wire without using the anode wire 220, the bonding wire becomes too long. If the bonding wire is too long, some defects such as a manufacturing defect may easily occur. Therefore, in such a case, the connection may be made via the anode wire 220 provided on the high-power light-emitting element array 10B.

In order to supply a large current to the high-power light-emitting element array 10B, power is supplied from both facing sides of the high-power light-emitting element array 10B by plural bonding wires. Since a current is supplied from at least both sides facing each other, as compared with a configuration in which the current is supplied from one side, the current is more likely to be uniformly supplied to the VCSEL-Bs, and a variation in a light emission amount of each VCSEL-B is reduced.

Here, the central region of the high-power light-emitting element array 10B refers to a center side with reference to ½ of a distance from a center to an end portion of the high-power light-emitting element array 10B. ½ of an end portion side is referred to as an end portion region.

In the high-power light-emitting element array 10B, no VCSEL-B is provided in a region occupied by the low-power light-emitting element array 10A. However, since the light emitted by the high-power light-emitting element array 10B is diffused by the diffusion plate 30, an irradiation pattern having a predetermined uniformity on an irradiation surface is obtained by optimizing the number of VCSEL-Bs and an optical output.

Drive Method

When it is desired to drive the low-power light-emitting element array 10A and the high-power light-emitting element array 10B at a higher speed, both the low-power light-emitting element array 10A and the high-power light-emitting element array 10B may be driven on a low side. The low-side drive refers to a configuration in which a drive unit such as a MOS transistor is located on a downstream side of a current path for a drive target such as a VCSEL. Conversely, a configuration in which the drive unit is located on an upstream side is referred to as high-side drive. In the first exemplary embodiment, in order to drive both the low-power light-emitting element array 10A and the high-power light-emitting element array 10B on the low side, cathodes of the low-power light-emitting element array 10A and the high-power light-emitting element array 10B are separated and driven independently. That is, in order to separate the cathodes, the low-power light-emitting element array 10A and the high-power light-emitting element array 10B are respectively formed on different substrates (here, the substrate 100 and the substrate 200), and the low-power light-emitting element array 10A and the high-power light-emitting element array 10B are laminated and integrated to separate the cathodes.

Figure 8:
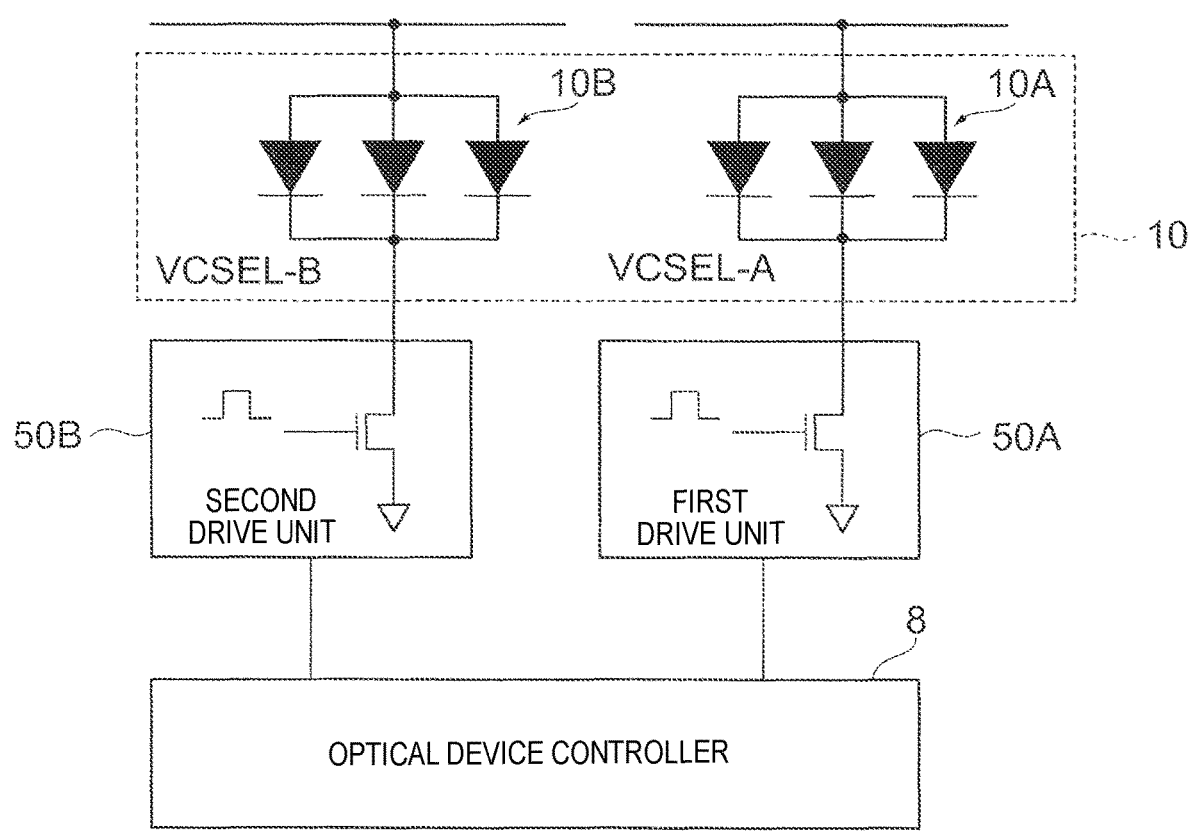
FIG. 8 is a diagram illustrating low-side drive.

FIG. 8 is a diagram illustrating the low-side drive. FIG. 8 shows a relationship among the VCSEL-A of the low-power light-emitting element array 10A, the VCSEL-B of the high-power light-emitting element array 10B, the first drive unit 50A, the second drive unit 50B, and the optical device controller 8. The first drive unit 50A and the second drive unit 50B are grounded via the MOS transistor. That is, when the MOS transistor is turned on/off, a cathode side of the VCSEL is turned on/off, so that the low-side drive is performed.

In FIG. 8, an anode side of the VCSEL-A of the low-power light-emitting element array 10A and an anode side of the VCSEL-B of the high-power light-emitting element array 10B are also separated. The anode sides may be driven separately, or the anode sides may be driven in common.

Instead of adopting a configuration in which the low-power light-emitting element array 10A and the high-power light-emitting element array 10B laminate each other, a part of the VCSEL array configured with the same epitaxial layer formed on a common substrate may be used for low power, and the other part may be used for high power. In this case, the anode electrodes on a front surface side are separated for low power and high power, but the cathode electrodes formed on the back surfaces of the substrates are common. Therefore, there is no choice but to use the high-side drive with the anodes separated. Therefore, when it is desired to drive the low-power light-emitting element array 10A and the high-power light-emitting element array 10B at a higher speed, the low-power light-emitting element array 10A and the high-power light-emitting element array 10B may be configured to laminate each other.

As a modified example of the configuration in which the common substrate is used for the low-power light-emitting element array 10A and the high-power light-emitting element array 10B, a p-type GaAs substrate may be adopted instead of the n-type GaAs substrate, cathode electrodes may be separated on a front surface side of the substrate, and the cathode electrodes may be driven on the low side. However, in this case, a lower DBR side, which has a larger number of pairs than an upper DBR, is of p-type having high light absorption and a high resistance value, and therefore power conversion efficiency is lowered. Therefore, when it is desired to give priority to the power conversion efficiency, the low-power light-emitting element array 10A and the high-power light-emitting element array 10B may laminate each other.

Figure 9A:
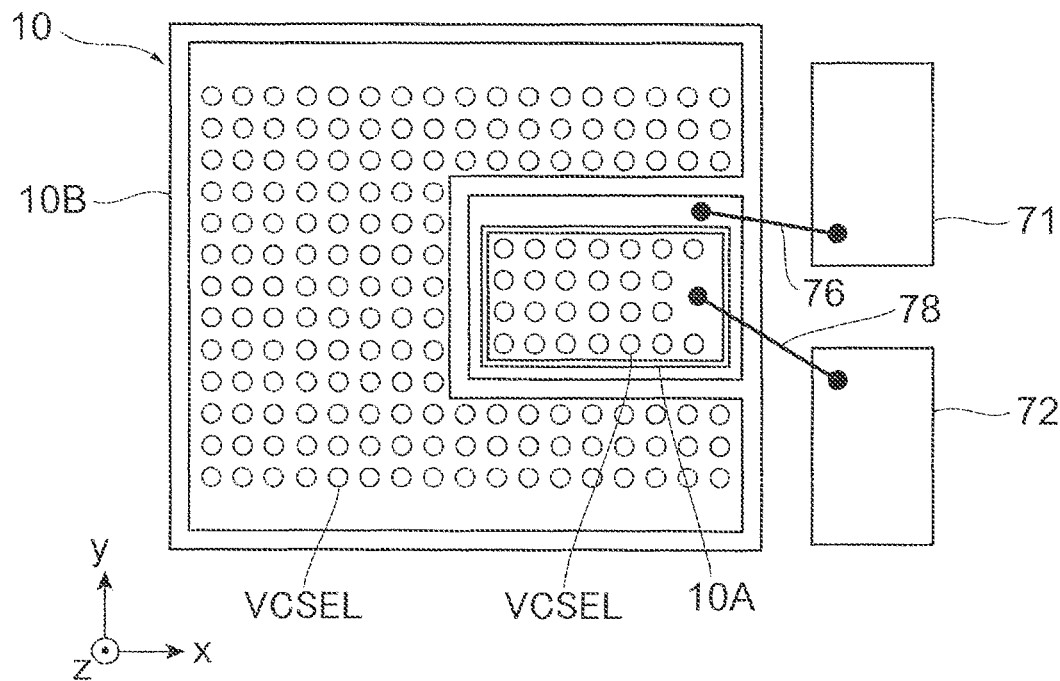
FIG. 9A shows a diagram illustrating the first modified example of an arrangement of the low-power light-emitting element array and the high-power light-emitting element array.
Figure 9B:
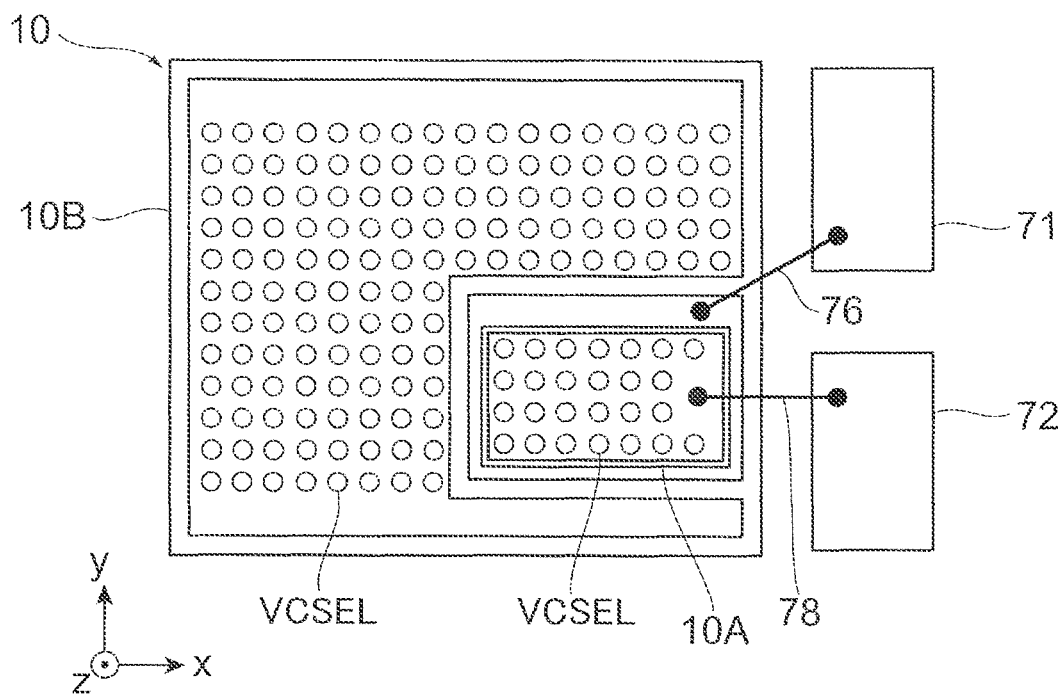
FIG. 9B shows a diagram illustrating the second modified example of an arrangement of the low-power light-emitting element array and the high-power light-emitting element array.

Modified Examples of Arrangement of Low-Power Light-Emitting Element Array 10A and High-Power Light-Emitting Element Array 10B FIGS. 9A and 9B show diagrams illustrating modified examples of an arrangement of the low-power light-emitting element array 10A and the high-power light-emitting element array 10B. FIG. 9A shows the first modified example, and FIG. 9B shows the second modified example. Here, the light-emitting element array chip 10, and the cathode pattern 71 and the anode pattern 72 for the low-power light-emitting element array 10A are shown.

In the first exemplary embodiment shown in FIG. 4, the low-power light-emitting element array 10A is disposed in the central region of the high-power light-emitting element array 10B. However, the low-power light-emitting element array 10A does not necessarily have to be disposed in the central region of the high-power light-emitting element array 10B as long as proximity of the object to be measured is detectable.

In the first modified example shown in FIG. 9A, the low-power light-emitting element array 10A is disposed in an end portion region of the high-power light-emitting element array 10B on a +x direction side. Also in this case, the VCSEL-As of the low-power light-emitting element array 10A are surrounded by the VCSEL-Bs of the high-power light-emitting element array 10B in three directions including a ±y direction side and an x direction side.

By doing so, the anode wire 220 and the bonding wire 77 shown in FIG. 7 are not required. Therefore, in manufacture of the light-emitting device 4, man-hours for connecting the bonding wire 77 are reduced.

In the second modified example shown in FIG. 9B, the low-power light-emitting element array 10A is disposed at a corner portion of the high-power light-emitting element array 10B on a +x direction side and a y direction side. Also in this case, the anode wire 220 and the bonding wire 77 shown in FIG. 7 are not required. Therefore, in manufacture of the light-emitting device 4, man-hours for connecting the bonding wire 77 are reduced.

A position on the high-power light-emitting element array 10B where the low-power light-emitting element array 10A is provided is not limited to the first exemplary embodiment shown in FIG. 4 or the first and second modified examples shown in FIGS. 9A and 9B. The position on the high-power light-emitting element array 10B where the low-power light-emitting element array 10A is provided may be provided at a position where an object to be measured is detected by irradiation of emitted light from the low-power light-emitting element array 10A.

Arrangement of Light-Emitting Element Array Chip 10 and Light-Amount Monitoring Light-Receiving Element 40 in Light-Emitting Device 4

Figure 10A:
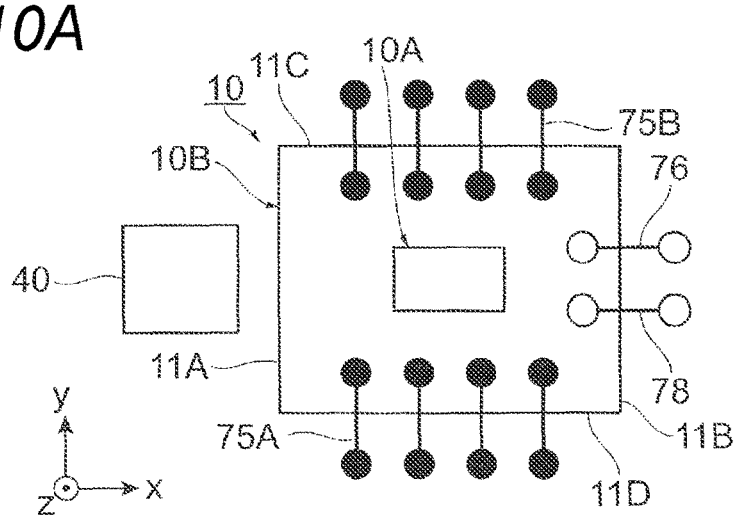
FIG. 10A shows are diagrams illustrating arrangements of the light-emitting element array chip and a light-amount monitoring light-receiving element in the light-emitting device according to the first exemplary embodiment.
Figure 10B:
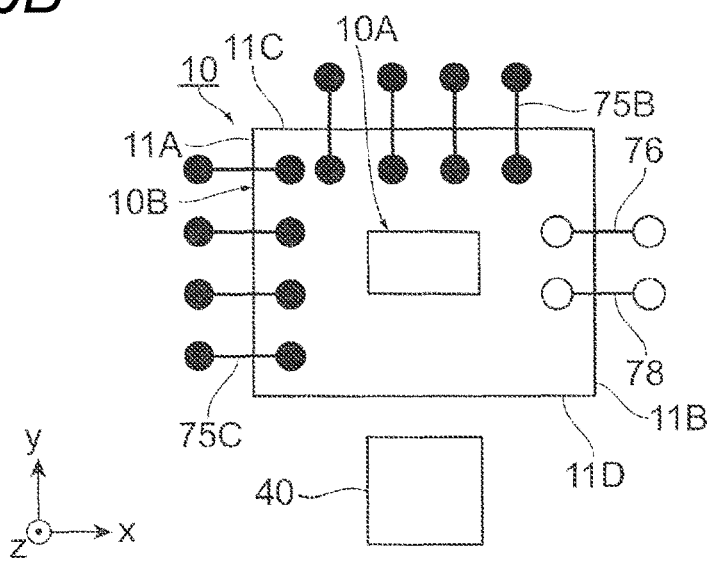
FIG. 10B shows are diagrams illustrating arrangements of the light-emitting element array chip and a light-amount monitoring light-receiving element in the light-emitting device according to the first comparative example.
Figure 10C:
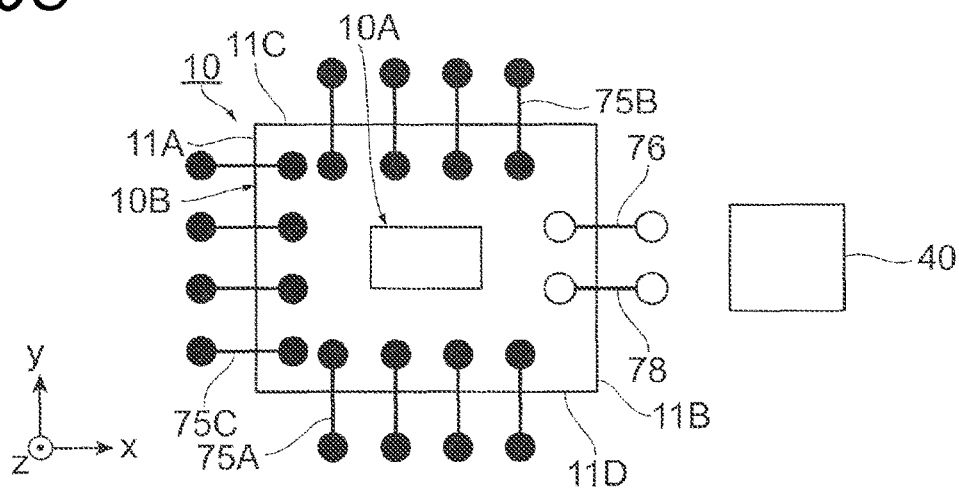
FIG. 10C shows are diagrams illustrating arrangements of the light-emitting element array chip and a light-amount monitoring light-receiving element in the light-emitting device according to the second comparative example.

FIGS. 10A, 10B, and 10C show diagrams illustrating arrangements of the light-emitting element array chip 10 and the light-amount monitoring light-receiving element 40 in the light-emitting device 4. FIG. 10A shows the arrangement in a first exemplary embodiment, FIG. 10B shows the arrangement in a first comparative example, and FIG. 10C shows the arrangement in a second comparative example. Here, the light-emitting element array chip 10, the light-amount monitoring light-receiving element 40, and the bonding wire are shown, and other description is omitted. In the light-emitting element array chip 10, it is assumed that the low-power light-emitting element array 10A is disposed in the central region of the high-power light-emitting element array 10B. In the light-emitting element array chip 10, a side surface in a −x direction is referred to as a side surface 11A, a side surface in a +x direction is referred to as a side surface 11B, a side surface in a +y direction is referred to as a side surface 11C, and a side surface in a −y direction is referred to as a side surface 11D. The side surface 11A and the side surface 11B face each other, and the side surface 11C and the side surface 11D face each other while connecting the side surface 11A and the side surface 11B.

As shown in FIG. 10A, in the arrangement in the first exemplary embodiment, the light-amount monitoring light-receiving element 40 is provided on a side surface 11A side of the light-emitting element array chip 10 in the −x direction. The bonding wires 75A and 75B that connect the anode electrode 218 (see FIG. 5B) of the high-power light-emitting element array 10B and the anode patterns 74A and 74B (see FIG. 7) provided on the circuit substrate 7 are provided so as to face the side surfaces 11C and 11D of the high-power light-emitting element array 10B in the ±y direction. The cathode electrode 114 of the low-power light-emitting element array 10A laminated on the high-power light-emitting element array 10B, that is, the bonding wire 76 (see FIG. 7) that connects the cathode wire 219 provided on the high-power light-emitting element array 10B and the cathode pattern 71 provided on the circuit substrate 7 is provided on a side surface 11B side of the high-power light-emitting element array 10B in the x direction. Similarly, the bonding wire 78 (see FIG. 7) that connects the anode electrode 118 of the low-power light-emitting element array 10A and the anode pattern 72 provided on the circuit substrate 7 is provided on the side surface 11B side of the high-power light-emitting element array 10B in the x direction.

By doing so, a current is supplied to the VCSEL-Bs symmetrically from the ±y direction of the high-power light-emitting element array 10B. Therefore, as compared with the first comparative example shown in FIG. 10B described later, a current is more likely to be uniformly supplied to the VCSEL-Bs of the high-power light-emitting element array 10B.

No bonding wire is provided on the side surface 11A side of the light-emitting element array chip 10 in the −x direction, which is a side on which the light-amount monitoring light-receiving element 40 is disposed. Therefore, the light-amount monitoring light-receiving element 40 is easily disposed close to the light-emitting element array chip 10. Therefore, as compared with the second comparative example shown in FIG. 10C described later, the light-amount monitoring light-receiving element 40 easily receives lights reflected by the diffusion plate 30 among emitted lights from the low-power light-emitting element array 10A and the high-power light-emitting element array 10B of the light-emitting element array chip 10.

In the first comparative example shown in FIG. 10B, the light-amount monitoring light-receiving element 40 is disposed on a side surface 11D side of the light-emitting element array chip 10 in the −y direction. Since the light-amount monitoring light-receiving element 40 is disposed close to the light-emitting element array chip 10, the bonding wires 75A that connect the anode electrode 218 (see FIG. 5B) of the high-power light-emitting element array 10B and the anode pattern 74A provided on the circuit substrate 7 are not used. In the first comparative example, an anode pattern is separately provided on the circuit substrate 7 on the side surface 11A side of the light-emitting element array chip 10 in the −x direction, and bonding wires 75C for connecting the anode electrode 218 of the high-power light-emitting element array 10B and the anode pattern separately provided on the circuit substrate 7 are provided.

In this way, since a current is supplied to the VCSEL-Bs of the high-power light-emitting element array 10B from a side surface 11C side in a +y direction and the side surface 11A side in the −x direction, it is difficult to supply the current to the VCSEL-Bs arranged on a side surface 11D side of the high-power light-emitting element array 10B in a −y direction. That is, it is difficult to cause the current to uniformly flow to the VCSEL-Bs of the high-power light-emitting element array 10B. Therefore, a variation in an amount of emitted light is likely to occur among the VCSEL-Bs.

In the arrangement of the second comparative example shown in FIG. 10C, the light-amount monitoring light-receiving element 40 is disposed on a side surface 11B side of the light-emitting element array chip 10 in a +x direction. Then, in addition to the bonding wires 75A and 75B in the arrangement of FIG. 10A, the bonding wires 75C added in the first comparative example of FIG. 10B are provided. Therefore, it is easy to cause a current to flow more uniformly to the VCSEL-Bs of the high-power light-emitting element array 10B.

However, in the second comparative example, the light-amount monitoring light-receiving element 40 is provided on the side surface 11B side in the +x direction where the bonding wires 76 and 78 for the low-power light-emitting element array 10A are provided. Therefore, the light-amount monitoring light-receiving element 40 is not disposed close to the light-emitting element array chip 10. Therefore, in the second comparative example, in the light-amount monitoring light-receiving element 40, a light-receiving amount of lights reflected by the diffusion plate 30 among emitted lights from the low-power light-emitting element array 10A and the high-power light-emitting element array 10B is reduced as compared with the arrangement in the first exemplary embodiment shown in FIG. 10A. That is, it is difficult to receive the lights reflected by the diffusion plate 30.

As described above, in the first exemplary embodiment, the bonding wires (the bonding wires 75A and 75B in FIG. 10A and the like) are provided such that the current is more uniformly supplied to the VCSEL-Bs of the high-power light-emitting element array 10B, and the light-amount monitoring light-receiving element 40 is disposed close to the light-emitting element array chip 10. Accordingly, it is possible to achieve both a more uniform current supply to the VCSEL-Bs and prevention of a decrease in a light-receiving amount of the light-amount monitoring light-receiving element 40.

In the above description, the low-power light-emitting element array 10A is disposed to laminate the high-power light-emitting element array 10B, but the low-power light-emitting element array 10A may be provided in the high-power light-emitting element array 10B.

SECOND EXEMPLARY EMBODIMENT

In the first exemplary embodiment, the VCSEL-B of the high-power light-emitting element array 10B uses the n-type lower DBR 202. In a second exemplary embodiment, a VCSEL-C that constitutes the high-power light-emitting element array 10B uses an i-type (intrinsic) lower DBR 302. That is, in the second exemplary embodiment, the VCSEL-C is used instead of the VCSEL-B. Since other configurations of the second exemplary embodiment are similar to those of the first exemplary embodiment, description thereof will be omitted.

VCSEL-C of High-Power Light-Emitting Element Array 10B

Figure 11:
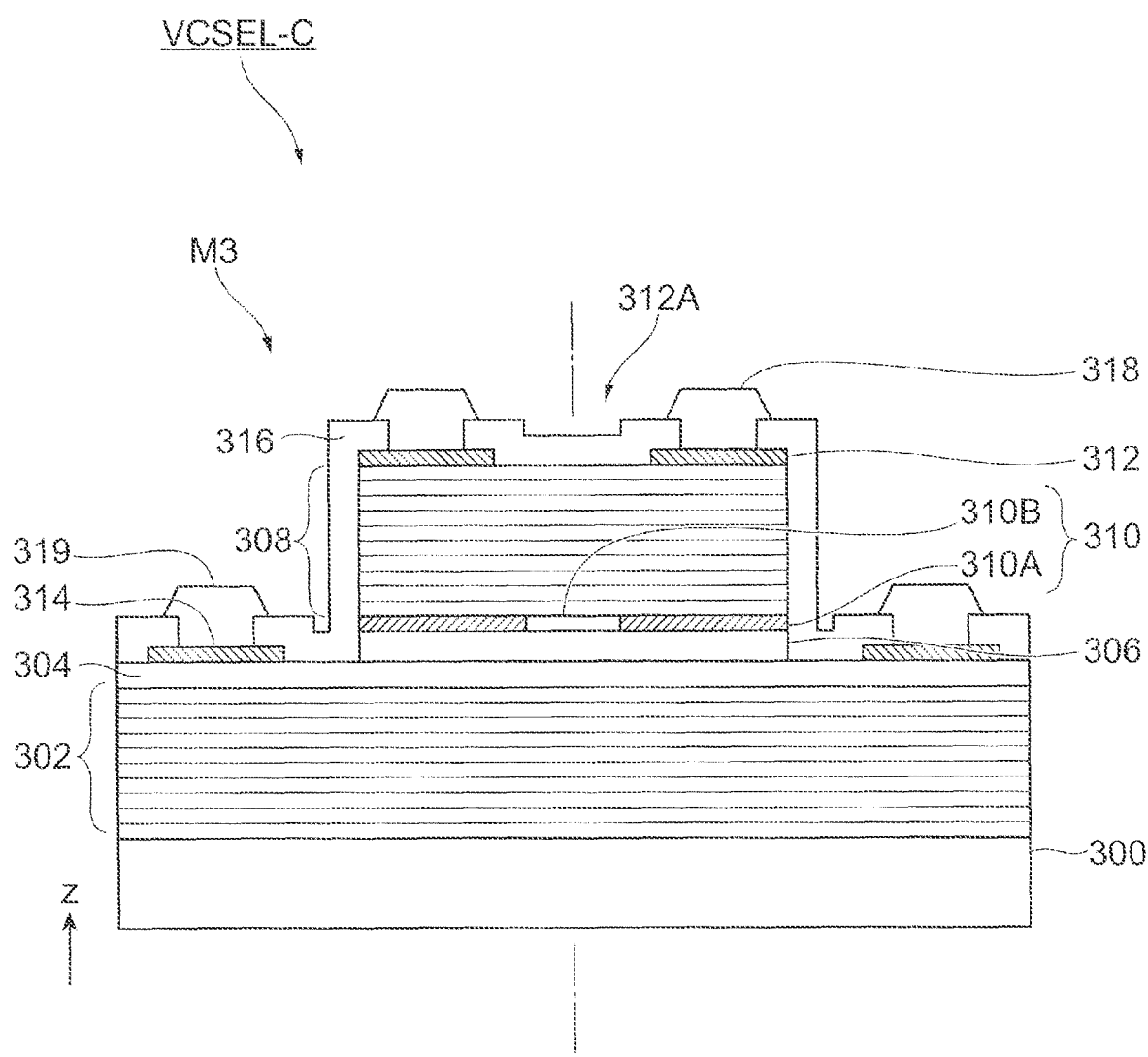
FIG. 11 is a diagram illustrating a cross-sectional structure of one VCSEL of the high-power light-emitting element array to which a second exemplary embodiment is applied.

FIG. 11 is a diagram illustrating a cross-sectional structure of one VCSEL-C of the high-power light-emitting element array 10B to which the second exemplary embodiment is applied.

In the VCSEL-C, an undoped i-type lower DBR 302 in which undoped i-type AlGaAs layers having different Al compositions are alternately laminated is provided on a semi-insulating i-type GaAs substrate 300 not doped with an impurity, and an n-type contact layer 304 is provided on the lower DBR 302. The VCSEL-C is configured by laminating, on the contact layer 304, an active region 306 including a quantum well layer sandwiched between an upper spacer layer and a lower spacer layer, and a p-type upper DBR 308 that is formed on the active region 306 and in which AlGaAs layers having different Al compositions are alternately laminated. A p-type AlAs current confinement layer 310 is formed on a lowermost layer of the upper DBR 308 or in the upper DBR 308. The substrate 300 may be a conductive substrate such as n-type or p-type, or may be an electrically insulating substrate such as glass. The substrate 300 is another example of a second substrate, and the i-type lower DBR 302 is another example of a non-p-type lower reflector.

Here, since the active region 306 and the upper DBR 308 are similar to the active region 106 and the upper DBR 108 of the VCSEL-A described in regard to the first exemplary embodiment, description thereof will be omitted.

The semiconductor layers laminated from the upper DBR 308 to the contact layer 304 are etched, so that a columnar mesa M3 is formed on the substrate 300. The current confinement layer 310 is exposed on a side surface of the mesa M3. In the current confinement layer 310, an oxidized region 310A selectively oxidized from the side surface of the mesa M3 and a conductive region 310B surrounded by the oxidized region 310A are formed. A planar shape of the conductive region 310B parallel to the substrate 300 is a shape that reflects an outer shape of the mesa M3, that is, a circular shape, and a center thereof substantially coincides with a central axis direction of the mesa M3 indicated by a dashed-dotted line.

An annular p-side electrode 312 made of metal in which Ti/Au or the like is laminated is formed on an uppermost layer of the mesa M3. The p-side electrode 312 is ohmically connected to a contact layer of the upper DBR 308. An inner inside of the annular p-side electrode 312 serves as a light-emission port 312A through which laser light is emitted to an outside. That is, the central axis direction of the mesa M3 is an optical axis. Further, an n-side electrode 314 is formed on a front surface of the contact layer 304. The n-side electrode 314 is ohmically connected to the contact layer 304. An inner front surface of the p-side electrode 312, which is the light-emission port 312A, is an emission surface.

An insulation layer 316 is provided so as to cover a front surface of the mesa M3 except for the light-emission port 312A, a portion where the p-side electrode 312 and an anode electrode 318 described later are connected, and a portion where the n-side electrode 314 and a cathode electrode 319 described later are connected. The anode electrode 318 is provided so as to be in ohmic contact with the p-side electrode 312, and the cathode electrode 319 is provided so as to be in ohmic contact with the n-side electrode 314.

That is, in the VCSEL-C of the high-power light-emitting element array 10B in the second exemplary embodiment, since the i-type lower DBR 302 is used, no cathode electrode is provided on a back surface of the substrate 300. In the VCSEL-C, the anode electrode 318 and the cathode electrode 319 are provided on a front surface side of the substrate 300.

In the VCSEL-C of the high-power light-emitting element array 10B, for example, the anode electrode 318 and the cathode electrode 319 are alternately provided in a stripe shape instead of using the anode electrode 218 in a portion where the VCSEL-B shown in FIG. 7 is disposed. A portion where the VCSEL-A is laminated (the cathode wire 219 and the anode wire 220 in FIG. 7) may be similar to that in FIG. 7.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting element array chip comprising:
a first light-emitting element array that includes a first light-emitting element including a first substrate, a light-emitting element layer formed on the first substrate, and a first cathode electrode electrically connected to the light-emitting element layer; and
a second light-emitting element array that includes a second light-emitting element including a second substrate, a non-p-type lower reflector formed on the second substrate, and a second cathode electrode electrically connected to the non-p-type lower reflector,
wherein the first light-emitting element array is provided on an emission surface side of the second light-emitting element array,
wherein the first cathode electrode is formed on a back surface side of the first substrate, and the first light-emitting element array is provided on a cathode wire provided on the emission surface side of the second light-emitting element array,
wherein the first light-emitting element array includes a first anode electrode on an emission surface side, and the first anode electrode and an anode wire provided on the emission surface side of the second light-emitting element array are connected by a bonding wire.

2. The light-emitting element array chip according to claim 1, wherein
a cathode pad connected to the cathode wire is provided on the emission surface side of the second light-emitting element array.

3. The light-emitting element array chip according to claim 1, wherein
an anode pad connected to the anode wire is provided on the emission surface side of the second light-emitting element array.

4. The light-emitting element array chip according to claim 1,
the first light-emitting element array is adhered to the emission surface side of the second light-emitting element array by an adhesive member.

5. The light-emitting element array chip according to claim 1, wherein
the first light-emitting element of the first light-emitting element array is surrounded by the second light-emitting element of the second light-emitting element array.

6. The light-emitting element array chip according to claim 5, wherein
the first light-emitting element array is provided in a central region of the second light-emitting element array.

7. The light-emitting element array chip according to claim 1, wherein
the first light-emitting element array is provided in an end portion region of the second light-emitting element array.

8. A light-emitting device comprising:
the light-emitting element array chip according to claim 1; and
a light diffusion member provided on a light emission path of the first light-emitting element array of the light-emitting element array chip and the second light-emitting element array of the light-emitting element array chip.

9. An optical device comprising:
the light-emitting device according to claim 8; and
a light-receiving unit configured to receive first reflected light emitted from the first light-emitting element array of the light-emitting device and reflected by an object to be measured, and second reflected light emitted from the second light-emitting element array of the light-emitting device and reflected by the object to be measured,
wherein the light-receiving unit outputs a signal corresponding to a time from when light is emitted from the first light-emitting element array to when the light is received by the light-receiving unit, and a signal corresponding to a time from when light is emitted from the second light-emitting element array to when the light is received by the light-receiving unit.

10. An information processing device comprising:
the optical device according to claim 9; and
a shape specification unit configured to specify a three-dimensional shape of the object to be measured based on the first reflected light or the second reflected light emitted from the first light-emitting element array or the second light-emitting element array of the optical device and reflected by the object to be measured.

11. The information processing device according to claim 10, further comprising
an authentication processing unit configured to perform an authentication processing related to use of the information processing device based on a specification result by the shape specification unit.

* * * * *